United States Patent
Lee

(10) Patent No.: US 6,734,804 B1
(45) Date of Patent: May 11, 2004

(54) AUTOMATIC CHANNEL MEMORY AND SELECTION METHOD FOR A TELEVISION SET

(75) Inventor: Jae-Kyung Lee, Daeku (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/516,936

(22) Filed: Mar. 1, 2000

Related U.S. Application Data

(63) Continuation-in-part of application No. 08/888,631, filed on Jul. 7, 1997, now abandoned.

(30) Foreign Application Priority Data

Jul. 8, 1996 (KR) .............................. 96/27609

(51) Int. Cl.⁷ ................................. H04Q 1/00
(52) U.S. Cl. ............... 340/825.72; 348/731; 455/180.1; 455/188.1
(58) Field of Search ......................... 340/825.72, 825.69, 340/2.1; 455/151.2, 180.1, 182.1, 185.1, 186.1, 186.2, 166.1, 168.1, 188.1; 348/731, 732, 734, 554, 555, 556, 558; 725/38

(56) References Cited

U.S. PATENT DOCUMENTS

| | | | |
|---|---|---|---|
| 4,737,993 A | * 4/1988 | DeVilbiss | ............... 455/180.1 |
| 4,776,038 A | 10/1988 | Testin et al. | |
| 5,020,140 A | * 5/1991 | Teskey | .................... 455/151.2 |
| 5,087,977 A | 2/1992 | Suizu | |
| 5,161,023 A | * 11/1992 | Keenan | ...................... 348/732 |
| 5,182,646 A | 1/1993 | Keenan | |
| 5,479,214 A | 12/1995 | Sakakibara et al. | |
| 5,508,762 A | * 4/1996 | Lee | ............................. 348/734 |
| 6,334,217 B1 | * 12/2001 | Kim | ............................ 735/38 |

FOREIGN PATENT DOCUMENTS

| | | |
|---|---|---|
| DE | 3801524 | 8/1988 |
| EP | 0 559 344 A2 | 8/1993 |

* cited by examiner

Primary Examiner—Edwin C. Holloway, III
(74) Attorney, Agent, or Firm—Finnegan, Henderson, Farabow, Garrett & Dunner, L.L.P.

(57) ABSTRACT

An automatic channel memory and selection method for a TV set for automatically memorizing each channel having a broadcast signal with a single input of an automatic channel set-up key regardless of a wireless broadcast mode or a cablecast mode, and sequentially increasing or decreasing the memorized channels regardless of whether a wireless broadcast channel or a cablecast channel is presently selected whenever a signal from a channel increase/decrease key is inputted and, in a case where a viewer directly inputs a desired number by using a number key, for distinguishing whether the inputted channel number belongs to a wireless broadcast channel or a cablecast channel and then outputting corresponding tuning data, whereby anyone can easily select a desired channel between the wireless broadcast channels and the cablecast channels and use of a broadcast mode selection key of a remote control is not necessary, whereby the production cost of a TV set can be reduced.

2 Claims, 6 Drawing Sheets

FIG. 3
CONVENTIONAL ART

| CHANNEL NUMBER | WIRELESS BROADCAST | CABLECAST |
|---|---|---|
| 1CH | X | O (EXCLUSIVE CABLECAST CHANNEL) |
| 2CH ≀ 13CH | IDENTICAL CHANNEL & FREQUENCY | |
| 14CH ≀ 69CH | IDENTICAL CHANNEL , DIFFERENT FREQUENCY | |
| 70CH ≀ 125CH | X | O (EXCLUSIVE CABLECAST CHANNEL) |

AUTOMATIC CHANNEL MEMORY AND SELECTION METHOD FOR A TELEVISION SET

This application is a continuation-in-part of U.S. patent application Ser. No. 08/888,631 now abandoned, file Jul. 7, 1997.

BACKGROUND OF THE INVENTION

1. Field of the Invention

The present invention relates to a channel selection device of a television, and in particular to an automatic channel memory and selection method of a television, capable of simply selecting a channel regardless of a cablecast or a wireless broadcast.

2. Description of the Related Art

FIG. 1 is a block diagram illustrating a general TV set, comprising a tuner 1 for converting a wireless broadcast signal RF or a cablecast signal CATV to an intermediate frequency signal, a sound signal processing unit 2 for restoring a sound intermediate frequency signal SIF to a sound signal and outputting the sound signal to a speaker SP, a video signal processing unit 3 for separating a video intermediate frequency signal VIF into a luminance signal Y and a chrominance signal C, a RGB matrix 4 for restoring the luminance signal Y and the chrominance signal C outputted from the video signal process unit 3 into a primary color signals R, G, B and, thus, outputting the primary color signals R, G, B to a color picture tube CPT, and a microcomputer 5 for performing a control operation in accordance with various control command signals inputted from a remote control unit 6.

With reference to FIGS. 1 to 3, the operation of the above described TV set will now be described.

FIGS. 2A and 2B depict a flow chart illustrating an automatic channel selection procedure and a channel selection procedure.

FIG. 3 is a table comparing a wireless broadcast signal and a cablecast signal according to each frequency and each channel, wherein CH1 and CH70 to CH125 are the exclusive cablecast channels, CH2 to CH13 are the channels in which the wireless broadcast and the channels in which the wireless broadcast and the cablecast have identical channel numbers, but separate frequencies.

First, as shown in step 10 in FIG. 2, when a TV viewer selects a wireless broadcast or a cablecast by using a broadcast mode selection key Air/CATV equipped in the remote control unit 6, the microcomputer 5 checks whether a signal from an automatic channel set-up key is inputted or not.

Here, as shown in steps 16 to 20 in FIG. 2, the broadcast mode selection key Air/CATV is a toggle key, so when the microcomputer 5 receives a signal from the broadcast mode selection key Air/CATV, in a case where the present mode is the wireless broadcast mode, the 10 microcomputer 5 switches the wireless broadcast mode to a cablecast mode, and conversely, in case the present mode is the cablecast mode, the microcomputer 5 switches the cablecast mode to the wireless broadcast mode.

And, as shown in steps 11 and 12 in FIG. 2, when the microcomputer 5 receives a signal from the automatic channel set-up key, the microcomputer 5 distinguishes the present broadcast mode. Here, if the distinguished mode is the wireless broadcast mode, the microcomputer 5 outputs tuning data corresponding to the wireless broadcast to the tuner 1, for thereby sequentially selecting wireless broadcast channels CH2 to CH69 and memorizing channels having wireless broadcast signals.

On the other hand, as shown in step 13 in FIG. 2, if the distinguished mode is the cablecast mode, the microcomputer 5 outputs tuning data corresponding to the cablecast to the tuner 1, for thereby sequentially selecting cablecast channels CH1 to CH125 and finally completing the automatic channel set-up operation by memorizing channels having cablecast signals. As shown in steps 14 and 15 in FIG. 2, after the automatic channel set-up operation, when the microcomputer 5 receives a signal from a channel increase/decrease key operated by the TV viewer, the microcomputer 5 sequentially outputs tuning data of a cablecast channel or a wireless broadcast channel from the present broadcast mode, in accordance with the previously completed automatic channel set-up.

Accordingly, the tuner 1 converts the wireless broadcast signal or the cablecast signal to an intermediate frequency signal in accordance with the tuning data and the sound signal processing unit 2 restores the sound intermediate frequency signal SIF outputted from the tuner 1 to the sound signal SP, for thereby outputting the sound signal to the speaker SP.

And, the video signal processing unit 3 separates the video intermediate frequency signal VIF into the luminance signal Y and the chrominance signal C and the RGB matrix 4 restores the luminance signal Y and the chrominance signal C to the primary color signals R, G, B and thus outputs the primary color signals R, G, B to the color picture tube CPT, whereby the wireless broadcast or the cablecast is displayed on a screen.

Therefore, the TV viewer is able to simply select a desired channel without inputting the desired channel numbers one by one.

Also, when the viewer directly inputs a desired channel number, the microcomputer 5 recognizes a channel input and outputs tuning data, corresponding to the desired channel number inputted by the viewer, to the tuner 1, for thereby selecting the desired channel.

However, according to the conventional channel selection method, for the viewer to have the television memorize all the channels with respect to wireless broadcasts and cablecasts by selecting a wireless broadcast mode or a cablecast mode by using the broadcast mode selection key Air/CATV and then pressing the automatic channel set-up key on the selected mode, this requires two steps.

And, although the channels having broadcast signals are memorized through the automatic channel set-up procedure, when the viewer wants to select a certain channel, the viewer has to select the wireless broadcast mode or the cablecast mode and again press the channel increase/decrease key, thereby causing the viewer inconvenience to perform multiple operation.

SUMMARY OF THE INVENTION

Accordingly, it is an object of the present invention to provide an automatic channel memory and selection method for a TV set capable of memorizing each channel having a broadcast signal in a single step upon inputting an automatic setup key, regardless of a wireless broadcast mode or a cablecast mode being selected.

It is another object of the present invention to provide an automatic channel memory and selection method for a TV set to sequentially increase or decrease a memorized channel number, whenever a signal from a channel increase/decrease key is inputted, regardless of a wireless broadcast channel or a cablecast channel being selected.

It is still another object of the present invention to provide an automatic channel memory and selection method for a TV set to judge, in a case where a viewer directly inputs a desired channel number by using a number key, whether the inputted channel number corresponds to a wireless broadcast channel or a cablecast channel and to then output corresponding tuning data.

To achieve the above objects, there is provided a method which includes a step for checking an input from an automatic channel set-up key; a step for sequentially selecting wireless broadcast channels for thereby memorizing channels having a wireless broadcast signal when the automatic channel set-up key is inputted; a step for sequentially selecting cablecast channels for thereby memorizing channels having a cablecast signal; a step for checking an input from a channel increase/decrease key; and a step, in a case where the channel increase/decrease key is inputted, for selecting a desired channel by increasing or decreasing by single channels from the present channel, regardless of whether the present channel is a wireless broadcast channel or a cablecast channel.

To achieve the above objects, there is also provided a method which includes a step for checking an input from the number key; a step for checking whether a channel number inputted by a number key belongs to a first range, a second range, or a third range; a step, when the inputted channel number belongs to the first range, for outputting tuning data of a corresponding channel and thereby selecting a channel; a step for outputting tuning data of a wireless broadcast in the case where the inputted channel number belongs to the second range and for recognizing the present channel as a wireless broadcast channel and thereby selecting the channel in the case where a broadcast signal is detected in the corresponding channel; a step for outputting tuning data of a cablecast channel when the broadcast signal is not detected in the above step and for recognizing the present channel as a cablecast channel and thereby selecting the channel; and a step for outputting only a tuning data of a cablecast channel and thereby selecting the channel when the inputted channel number belongs to the third range.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a table comparing wireless broadcast signal and cablecast signal frequencies and channel numbers according to a conventional art;

DETAILED DESCRIPTION OF THE INVENTION

Figure 1:
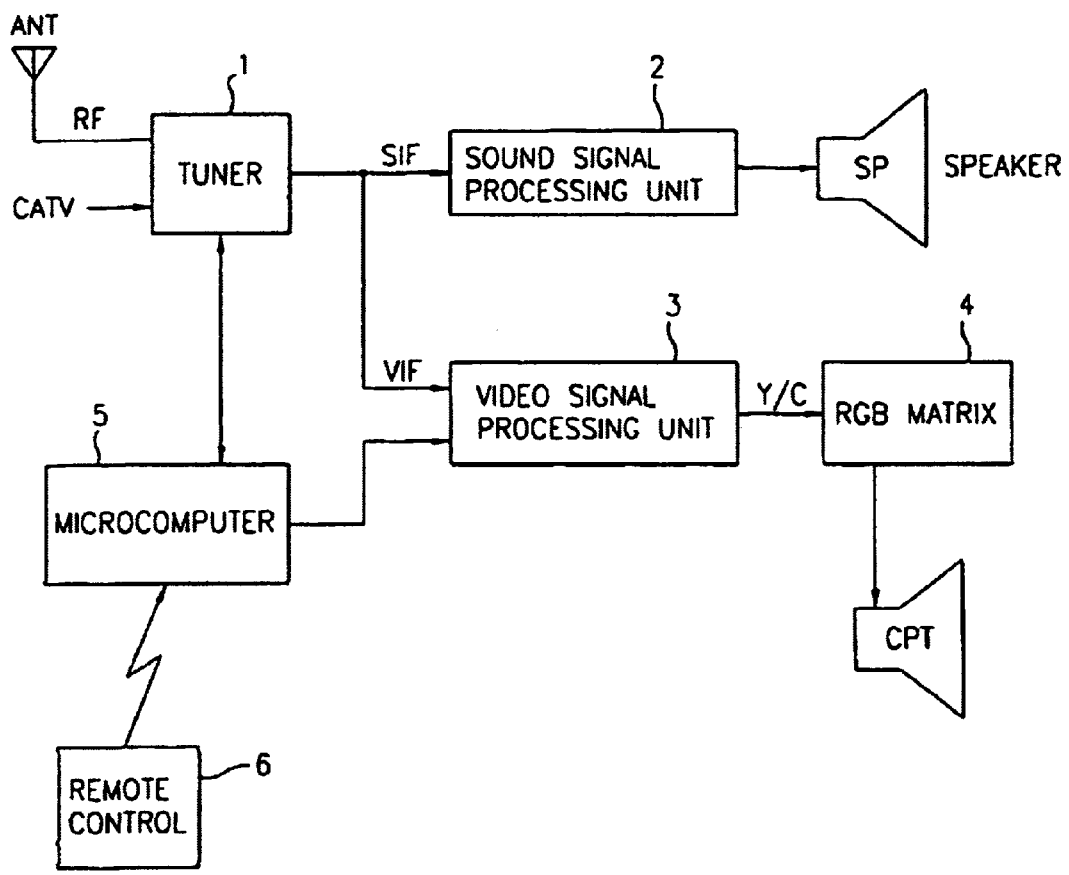
FIG. 1 is a block diagram of a general TV set according to a conventional art.
Figure 2A:
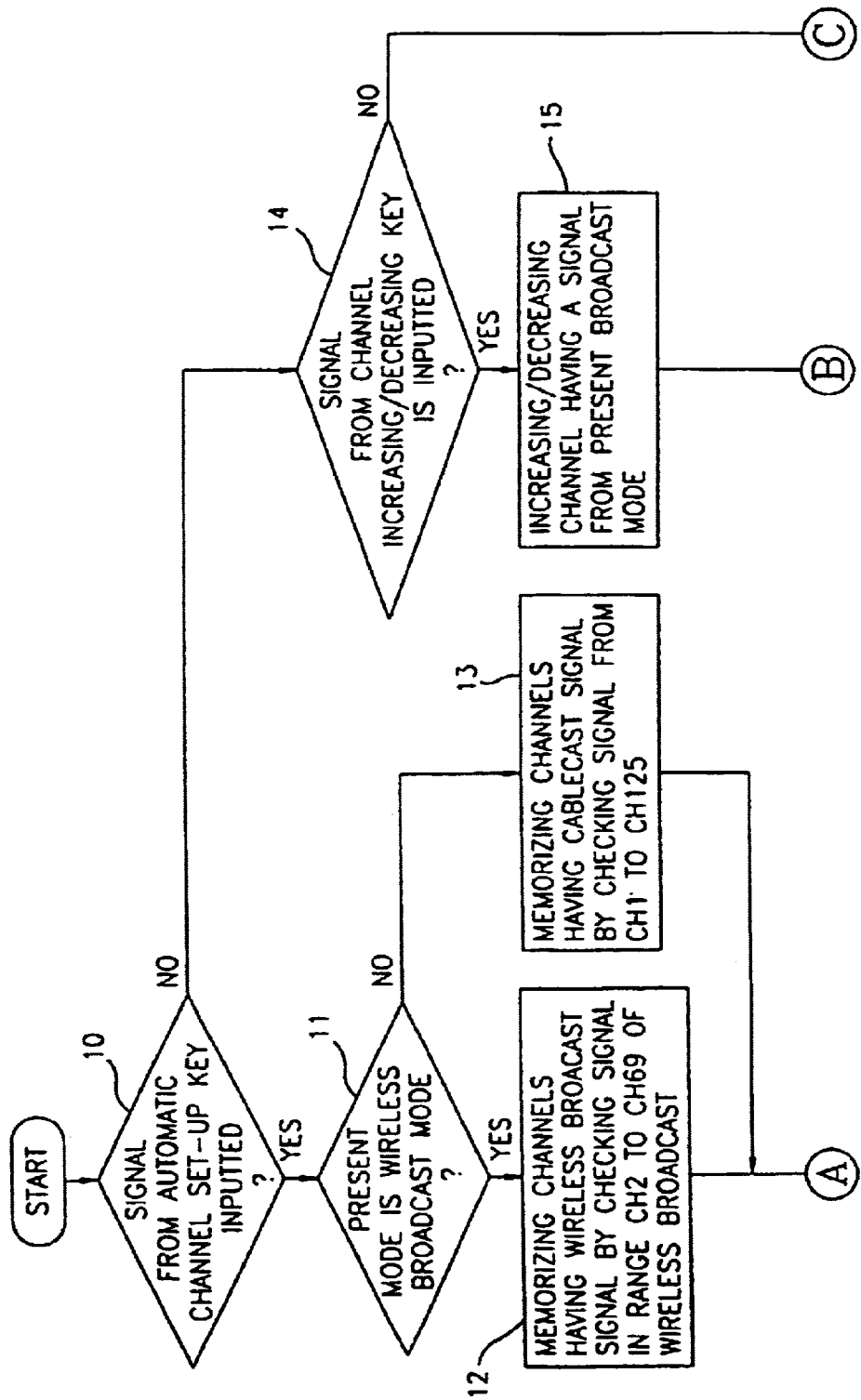
FIGS. 2A and 2B show a flow chart illustrating a conventional automatic channel set-up and channel selection procedure in the TV set according to FIG. 1.
Figure 2B:
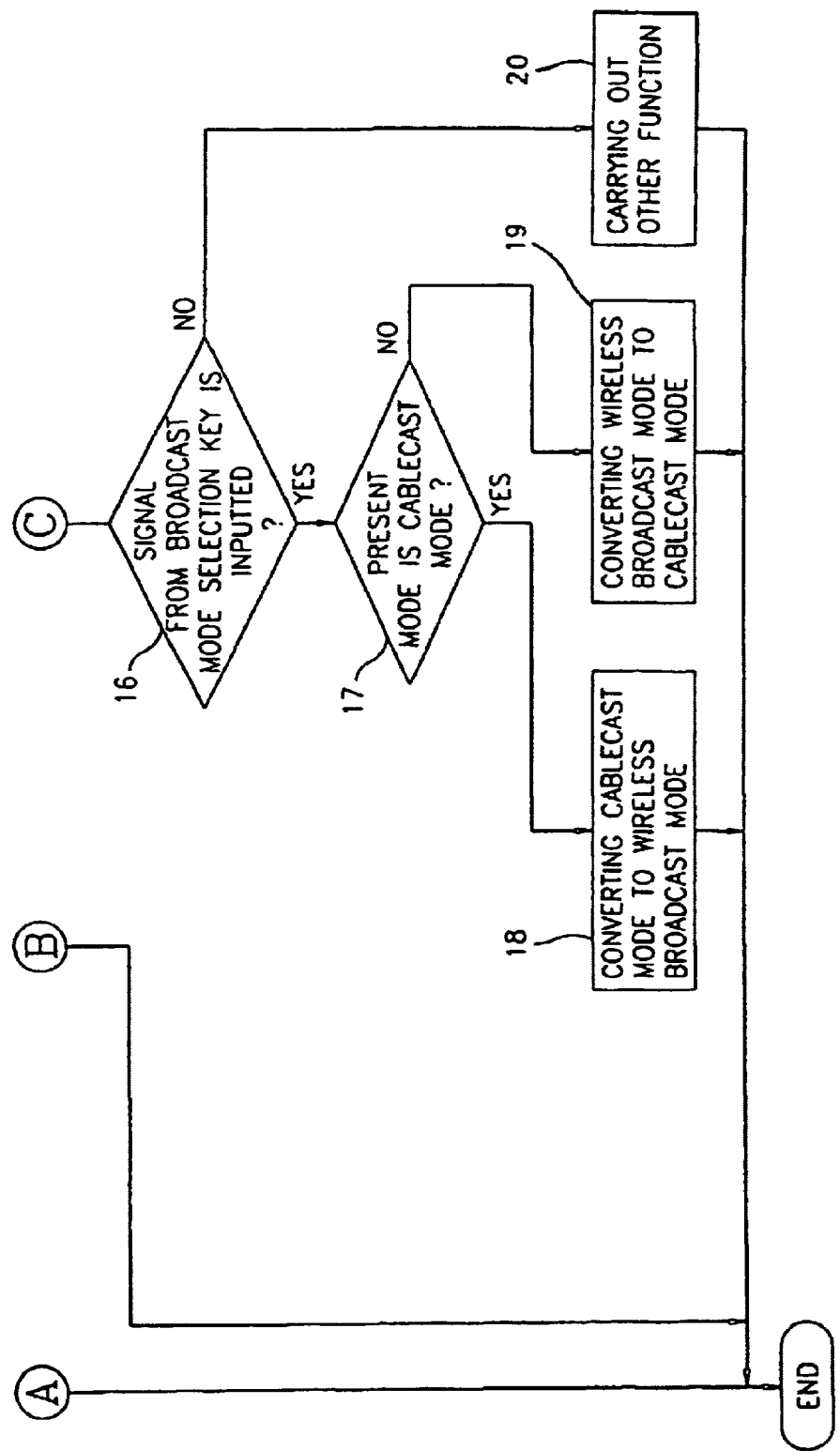

For describing the method of the present invention, the general TV set illustrated in FIG. 1 is also applied.

FIG. 3 is a table comparing wireless broadcast signal and cablecast signal frequencies and channel numbers, wherein CH1 and CH70 to CH125 are exclusively cablecast channels, CH2 to CH13 are channels for which the wireless broadcast and the cablecast commonly have identical channel numbers and frequencies, and CH14 to CH69 are channels for which the wireless broadcast and the cablecast have identical channel numbers, but separate frequencies.

Figure 4:
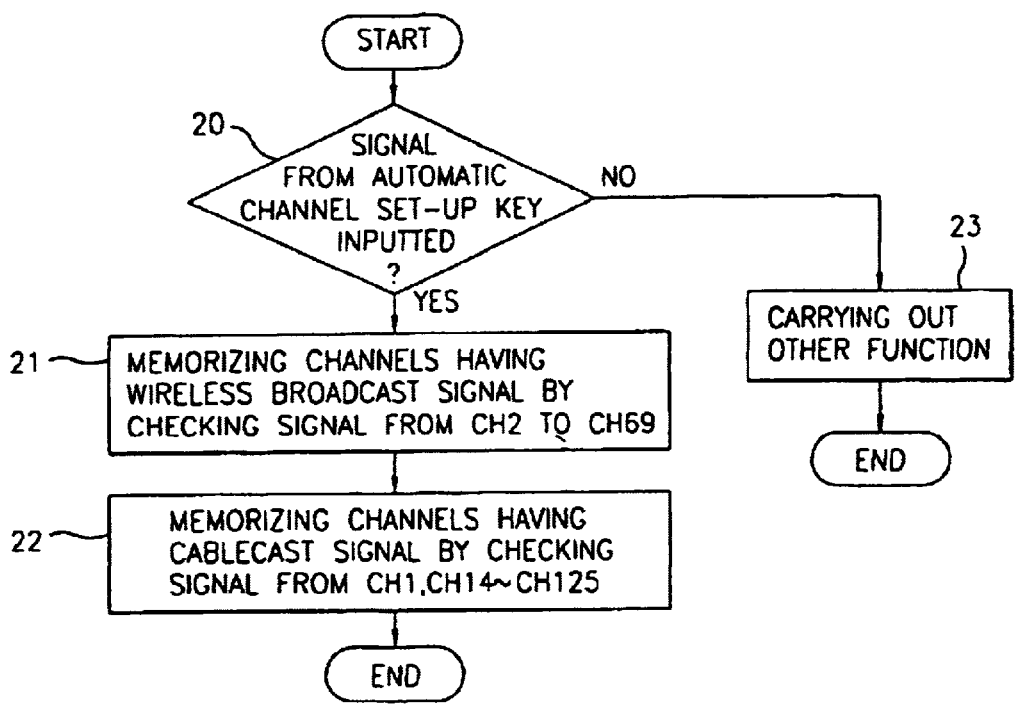
FIG. 4 is a flow chart illustrating an automatic channel memory method for a TV set according to the present invention.
Figure 5:
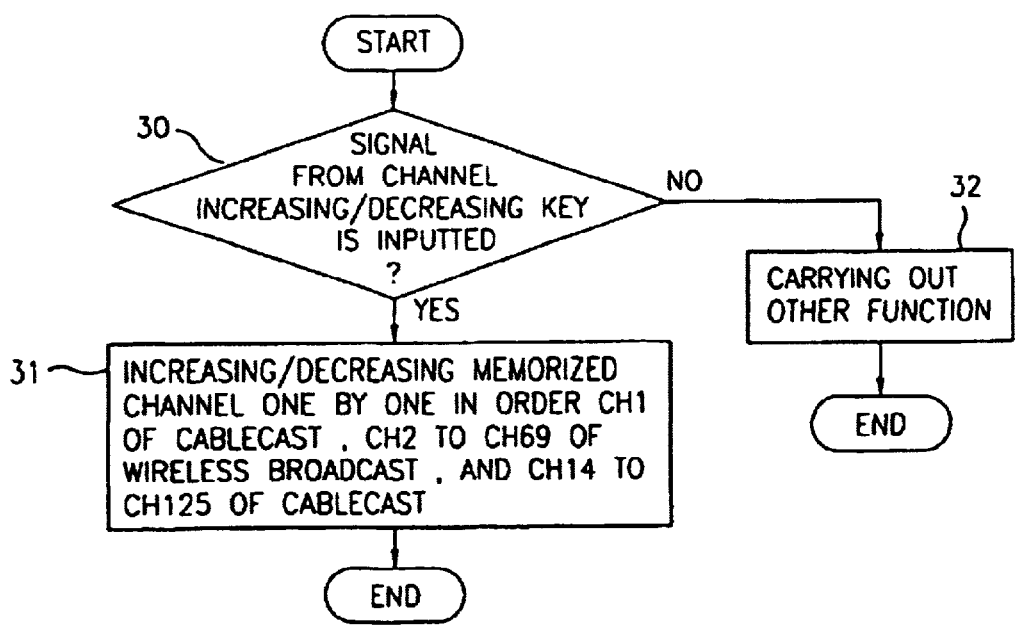
FIG. 5 is a flow chart illustrating an automatic channel selection method for a TV set according to the present invention in accordance with a channel increase/decrease key input.
Figure 6:
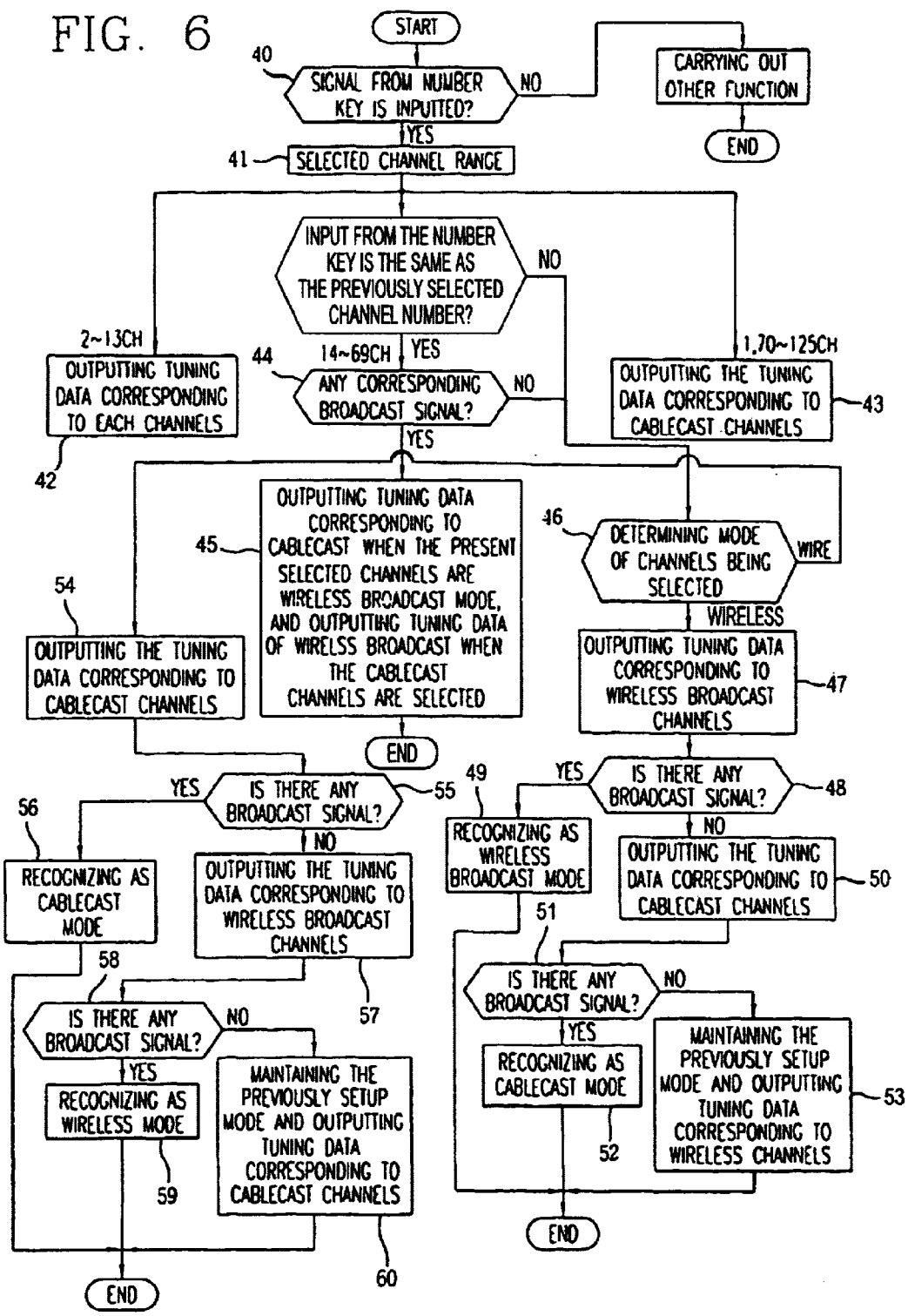
FIG. 6 is a flow chart illustrating an automatic channel memory method for a TV set according to the present invention in accordance with a channel number input.

With reference to FIGS. 4 to 6, the automatic channel memory and selection method for a TV set according to the present invention will now be described. First, as shown in steps 20 to 22 in FIG. 4, when a viewer presses the automatic channel set-up key of the remote control unit 6, the microcomputer 5 sequentially outputs a tuning data to the tuner 1. Then, the microcomputer 5 examines the wireless broadcast channels CH2 to CH69 in order, thereby memorizing the channels having a wireless broadcast signal, and then examines the cablecast channels CH1 and CH14 to CH125 in order, thereby memorizing channels having a cablecast signal, whereby the automatic channel set-up procedure is completed.

As shown in steps 30 and 31 in FIG. 5, after the automatic channel set-up has been completed, if the viewer presses the channel increase/decrease key, the microcomputer 5 increases or decreases the channel numbers from the present channel in the order of CH1 of the cablecast, CH2 to CH69 of the wireless broadcast, and CH14 to CH125 of the cablecast among the previously set-up channels regardless of whether the present channel was a wireless broadcast channel or a cable channel.

Accordingly, the viewer can simply select a desired channel without pressing the broadcast mode selection key, and watch the desired program.

When the viewer directly selects a channel number by inputting a number key, the micro computer 5 checks whether the inputted channel number belongs to the range of the same frequency of the same channel(CH2 to CH13), the range of cablecast channels(CH1, CH70 to CH125), or the range of other frequencies of the same channel(CH14 to CH69).

As a result, if the inputted channel number belongs to the range of CH2 to CH13, the microcomputer 5 outputs tuning data for the corresponding channel regardless of the wireless broadcast channel or the cablecast channel.

However, in the range of CH14 to CH69, the wireless broadcast channel and the cablecast channels have the identical channel number, but have a different frequency. Since the same channel number may exist (in a case where a broadcast signal is on both wireless broadcast channel 14 and cablecast channel 14), it is judged whether the previously selected channel number is the same as the presently selected channel number in order to select a single one among two broadcast channels in step 44. If the two channel numbers are the same (in a case where the channel number 14 is inputted while viewing the wireless or cablecast CH14), the microcomputer outputs tuning data for a cabelcast broadcast channel when the presently selected channel is a wireless broadcast channel. (In a case where CH14 is inputted while viewing the wireless CH14, the microcomputer outputs tuning data for the cablecast CH14.)

If the presently selected channel is a cablecast channel, the microcomputer outputs tuning data for a wireless broadcast channel in step 45. (In a case where the channel number 14 is inputted while viewing the cablecast CH14, the microcomputer outputs tuning data for the wireless broadcast CH14.)

If a selected channel number is not the same as the presently selected channel number it is judged whether the presently selected channel is a cablecast channel or a wireless broadcast channel, and when the presently selected channel is the wireless mode(when the channel number 16 is inputted while viewing the wireless CH14, it is judged that the presently selected channel is the wireless mode because a wireless channels is viewed), the microcomputer outputs tuning data corresponding to the wireless channel and judges whether a broadcast signal exists or not (checks whether a broadcast signal of the wireless 16CH exists or not.), outputs the broadcast signal if there is a broadcast signal, and judges the presently selected channel as the wireless broadcast mode in steps 47 to 49 (wireless broadcast mode set). If there is no broadcast signal, the microcomputer outputs tuning data for a cablecast channel and judges whether a broadcast signal exists or not (checks whether a broadcast signal of the cable CH16 exists or not), thereby outputting a broadcast signal and judging the presently selected channel as the cablecast mode at the same time in steps 50 to 52 (cablecast mode set). If there is no cablecast signal, the previously selected mode is maintained and tuning data corresponding to a wireless channel is outputted. For example, this occurs where there is no broadcast signal of a wireless or cablecast channel 16 when the channel number 16 is inputted while viewing the wireless channel 14 in step 53.

In the above step 46, if the presently selected channel is the cable mode (when the channel number 16 is inputted while viewing the wireless CH14, it is judged that the presently selected channel is the cablecast mode because a cabelcast channels is viewed.), the microcomputer outputs tuning data corresponding to the cablecast channel and judges whether a broadcast signal exists or not (checks whether a broadcast signal of the cablecast 16CH exists or not.), outputs the broadcast signal if there is a broadcast signal, and judges the presently selected channel as the cablecast mode in steps 54 to 56 (cablecast mode set). If there is no broadcast signal, the microcomputer outputs tuning data for a wireless channel and judges whether a broadcast signal exists or not (checks whether a broadcast signal of the wireless CH16 exists or not), thereby outputting a broadcast signal and judging the presently selected channel as the wireless broadcast mode at the same time in steps 57 to 59 (wireless broadcast mode set). If there is no wireless signal, the previously selected mode is maintained and tuning data corresponding to a cablecast channel is outputted. This occurs, for example, where there is no broadcast signal of a wireless or cablecast channel 16 when the channel number 16 is inputted while viewing the cablecast channel 14 in step 53.

As described above, the present invention has advantages that, with a single input of an automatic channel set-up key, the present invention is capable of automatically memorizing a channel having a broadcast signal by scanning the wireless broadcast or the cablecast channel and selecting a desired channel only with a channel increase/decrease key, without using a broadcast mode selection key Air/CATV, in case of selecting a channel by using the channel increase/decrease key. Furthermore, the present invention can memorize the channels with a single input of an automatic channel set-up key and then select a channel by using the channel increase/decrease key, whereby anyone can easily select a desired wireless broadcast channel or cablecast channel and, in addition, since use of the broadcast mode selection key on a remote control is not necessary, the production cost of a TV set can be reduced.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. A channel selection method for a TV set, comprising:
checking an input from a number key;
checking whether a presently selected channel number corresponding to the input from the number key is the same as a previously selected channel number of a first broadcast mode;
outputting tuning data of the selected channel number of a second broadcast mode, when the presently selected channel number is the same as the previously selected channel number; and
outputting channel data of the first broadcast mode of the previously selected channel number and determining whether a broadcast signal exists on the presently selected channel number, when the presently selected channel number is not the same as the previously selected channel number.

2. A channel selection method for a TV set, comprising:
checking an input from a number key;
checking whether a presently selected channel number corresponding to the input from the number key is the same as a previously selected channel number;
changing a broadcast mode and outputting tuning data of the selected channel number, when the presently selected channel number is the same as the previously selected channel number;
determining the broadcast mode of the previously selected channel number, when the presently selected channel number is not the same as the previously selected channel number;
outputting tuning data of a wireless broadcast corresponding to the presently selected channel number when the broadcast mode of the previously selected channel number is a wireless broadcast mode and when a broadcast signal is detected on the presently selected channel number;
outputting tuning data of a cablecast corresponding to the presently selected channel number when the broadcast mode of the previously selected channel number is a wireless broadcast mode and when a wireless broadcast signal is not detected on the presently selected channel number;
maintaining the previously selected channel and outputting tuning data of the previously selected channel when no broadcast signal is detected on either a wireless broadcast channel or a cablecast channel corresponding to the presently selected channel number;
outputting tuning data of a cablecast corresponding to the presently selected channel number when the broadcast mode of the previously selected channel number is a cablecast and when a broadcast signal is detected on the presently selected channel number; and
outputting tuning data of a wireless broadcast corresponding to the presently selected channel number when the broadcast mode of the previously selected channel number is a cablecast and when a cablecast broadcast signal is not detected on the presently selected channel number.

* * * * *